SEMICONDUCTOR CIRCUIT FOR A-C TO D-C CONVERSION
OR FREQUENCY MULTIPLICATION

Filed Aug. 8, 1966

INVENTOR.
HERBERT K. BAEHRE
BY
Moody and Phillion
ATTORNEYS

United States Patent Office 3,419,787
Patented Dec. 31, 1968

3,419,787

SEMICONDUCTOR CIRCUIT FOR A-C TO D-C CONVERSION OR FREQUENCY MULTIPLICATION

Herbert K. Baehre, Costa Mesa, Calif., assignor to Collins Radio Company, Cedar Rapids, Iowa, a corporation of Iowa Filed Aug. 8, 1966, Ser. No. 570,921
2 Claims. (Cl. 321—43)

ABSTRACT OF THE DISCLOSURE

A circuit for A-C to D-C conversion or frequency multiplication comprising a series circuit consisting of first impedance means, the parallel combination of a PNP transistor and an NPN transistor, and second impedance means connected across a D-C power supply. Voltage divider means, also connected across the power supply, bias said transistors at or near their conductivity threshold. A pair of capacitors arranged in parallel couple an A-C input signal source to the base electrodes of the two transistors so that the said transistors are conductive during alternate half cycles of the input signal.

This invention relates generally to A-C to D-C converters and more specifically to A-C to D-C converters having relatively low current drain, substantially zero D-C offset, and a high input impedance.

There are in the prior art a great many A-C to D-C converters covering a wide range of requirements. In some applications such requirements are quite stringent. For example, in many automatic gain controlled circuits (AGC) used in high-quality electronic gear it is desired that said automatic gain controlled circuits function with minimum di.tortion in converting the signal to a D-C AGC signal. Furthermore, in many applications of automatic gain control circuits, it is desirable that a low current drain be maintained when no A-C to D-C conversion is occurring. Such low current drain is desirable not only from a conservation of energy viewpoint in applications where space is at a premium and power supplies must be kept small, but also from the viewpoint of component life.

Many prior art A-C to D-C conversion circuits employ diodes which have a low current drain and which, in most cases, have practically no current drain. However, the diodes do require a certain minimum threshold voltage (D-C offset) before conduction begins. Such minimum threshold voltage introduces distortion in the circuit, especially at low signal levels by preventing A-C to D-C conversion until the amplitude of the A-C voltage exceeds the threshold voltage of the diodes. A further disadvantage of diodes in many applications is a low input impedance.

Other prior art A-C to D-C converters employ vacuum tubes which do not have the inherent problem of D-C offset voltage as do diodes. On the other hand, vacuum tubes usually exhibit a substantial current drain even in the absence of any A-C input signal being supplied thereto. Such current drain is necessary since vacuum tubes must be maintained in a conductive state in order to effectively respond to low level A-C input signals.

A primary object of the present invention is an A-C to D-C converter having zero D-C offset and also having a low current drain.

A second object of the invention is an A-C to D-C converter having a high input impedance, a substantially zero D-C offset, and a low current drain.

A third purpose of the invention is a high impedance A-C coupled A-C to D-C converter having substantially zero D-C offset.

A fourth aim of the invention is an A-C coupled A-C to D-C converter having low current drain.

A fifth object of the invention is an A-C to D-C conversion circuit which can also be employed, with slight modifications in component values, as a frequency doubler having low current drain.

A sixth object of the invention is the improvement of A-C to D-C converters and frequency doublers generally.

In accordance with the invention, there is provided an A-C to D-C converter comprising an NPN and a PNP transistor connected in parallel arrangement across a power supply and through common load resistors positioned on either side of said parallel combination, and with the collector of each of said transistors being connected to the emitter of the other transistor. First and second capacitive means connect an A-C input signal, respectively, to the base electrodes of said NPN and PNP type transistors. With the transistors biased just into their conductive areas there will be only a small current drain and substantially zero D-C offset, so that the positive half-cycles of the input signal will produce increased conductivity in the NPN type transistor and negative half-cycles of the A-C input signal will cause increased conductivity in the PNP type transistor; thus producing full wave rectification of the A-C input signal across both of the two common load resistors.

Important features of the invention are substantially zero D-C offset low current drain, and A-C coupled high input impedance.

In accordance with another feature of the invention, an application thereof as a frequency doubler, with the advantages of the A-C to D-C converter described above, can be obtained by employing a square wave input signal and by decreasing the RC time constant of the coupling capacitors and their discharge paths.

The above-mentioned and other objects and features of the invention will be more fully understood from the following detailed description thereof when read in conjunction with the drawing in which.

Figure 1:
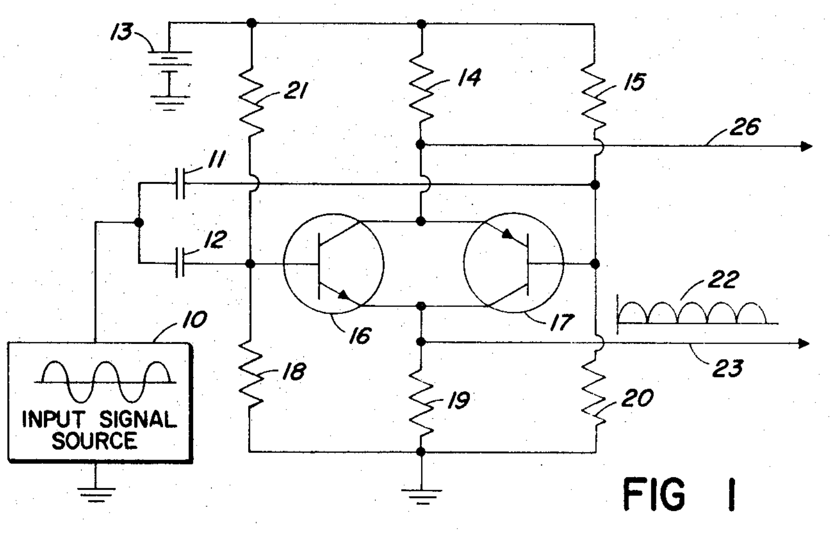
FIG. 1 shows a schematic sketch of the invention.

In FIG. 1 NPN type transistor 16 and PNP type transistor 17 are connected in parallel with respect to a series circuit comprising the battery source 13, common resistor 14, and common resistor 19, which returns to the battery through ground potential. Resistors 21 and 18 form a potential divider to provide a biasing voltage for the base of transistor 16. Similarly, resistors 15 and 20 form a potential divider to provide a biasing voltage for the base of transistor 17.

The biasing voltages applied to the bases of transistors 16 and 17 are of a magnitude as to bias said transistors just into the area of conductivity so that the current drain is very low, but at the same time having substantially no D-C voltage offset. D-C voltage offset is defined as that amount of voltage which must be supplied to the bases of transistors 16 and 17 before conductivity is increased in the transistors. With the biasing arranged as discussed above, any input signal supplied from source 10 will cause an immediate and substantially linear increase in the current output of one or the other of transistors 16 or 17.

As indicated above, the input signal to be rectified is supplied from input signal source 10 through coupling capacitors 11 and 12 to the bases of transistors 17 and 16, respectively.

During the positive half-cycles of the input signal the NPN transistor 16 is caused to become more conductive. The said positive half-cycles will have virtually no effect on the collector current output of the transistor 17 but simply serve to drive the transistor 17 into a cutoff condition.

However, during the negative half-cycles of the input signal the transistor 17 will be caused to become conductive by virtue of the negative half-cycles being supplied to the base thereof through coupling capacitor 11. Said negative half-cycles will, however, cause transistor 16 to become nonconductive.

Capacitor 11 and capacitor 12 will both acquire some charge due to the alternating nature of the signal source. For example, during the positive half-cycles of the input signal from source 10, capacitor 12 will acquire a slightly negative charge on the right-hand plate thereof, i.e., relative to the static condition of the circuit when no input signal is being supplied from source 10. Thus as the magnitude of the positive half-cycle begins to decrease, the transistor 16 will tend to be cut off slightly before the zero crossover point of the input signal source, thereby introducing phase distortion. However, such shift in phase can be made relatively small by proper selection of values of capacitors 11 and 12 and of discharge resistors 15 and 18.

As another example of the effect of the RC time constant on circuit operation, assume the instance where the negative half-cycle is being supplied from source 10. During such time the transistor 17 will be conductive and a positive charge will end to be built up on the right-hand plate of capacitor 11, i.e., relative to the static condition of the circuit when no input signal is being supplied. Under such conditions, as the input signal begins to go positive from its negative peak, the right-hand plate of capacitor 11 will also go positive and will tend to cut off transistor 17 slightly before the zero crossover time of the input signal.

The output from the circuit may be taken either across the common resistor 19 on output terminal 23 or the common resistor 14 on output terminal 26. The output waveform is as shown in waveform 22 and can be seen to be substantially a full wave rectification of the input signal. Such full wave rectification can then be passed into a standard filter (not shown) to produce a D-C voltage with ripple of a desired tolerance.

Figure 2:
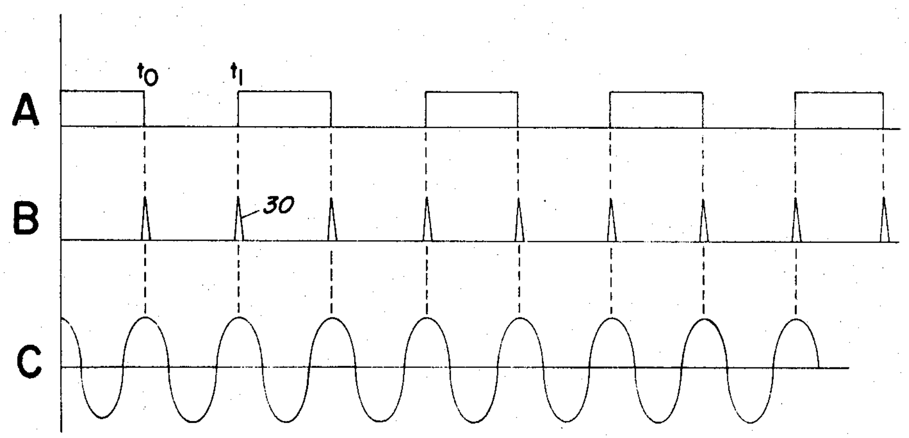
FIG. 2 shows the signal waveforms at various points in the circuit of FIG. 1 when employed as a frequency doubler.

With the aid of the curves of FIG. 2, the use of the circuit of FIG. 1 as a frequency doubler will now be discussed. The square waveform of FIG. 2*a* is supplied from input signal source 10 to the circuit of FIG. 1. At each transition point either from positive-to-negative or from negative-to-positive of the square wave signal of FIG. 2*a*, either transistor 16 or transistor 17 will become momentarily conductive. More specifically, during the positive-to-negative transition of the square wave, as at time $t_0$ for example, the base of transistor 17 is driven negative to cause transistor 17 to become conductive. However, due to the short RC time constant involved, capacitor 11 will quickly charge through resistor 15 so that transistor 17 is again cut off. It is to be understood that when the circuit of FIG. 1 is employed as a frequency doubler, the transistors 16 and 17 should be biased into a cutoff condition.

During the positive-to-negative transition at time $t_0$ the transistor 16 will remain nonconductive, since such transition serves only to drive the base of transistor 16 more negative, and deeper into its nonconductive area.

During the negative-to-positive transition of the waveform of FIG. 2*a*, as at time $t_1$, the transistor 16 is caused to become conductive. However, capacitor 12 will quickly become discharged through resistor 18 to cause the transistor 16 to become nonconductive. Thus the pulse 30 is produced across common load resistor 19 at time $t_1$.

The negative-to-positive transition will drive the base of the transistor 17 into its nonconductive area of operation.

Thus from the applied square wave input signal of FIG. 2*a* (from source 10) there is produced across common load resistor 19 a series of pulses, as shown in FIG. 2*b*, which occur at a frequency equal to twice the frequency of the square wave input of FIG. 2*a*.

By suitable filtering means, the first harmonic of the waveform of FIG. 2*b* can be extracted therefrom and, as shown in FIG. 2*c*, is twice that of the frequency of the square wave of FIG. 2*a*.

It is to be understood that the forms of the invention shown and described herein are but preferred embodiments thereof and that various changes may be made in circuit design and arrangement without departing from the spirit or the scope thereof.

I claim:

1. An A-C to D-C converter comprising:

power supply means;

a series circuit arrangement connected across said power supply means and comprising first common resistive means, the parallel combination of an NPN and a PNP type transistor, and second common resistive means;

said transistors each having emitter, collector, and base electrodes;

the emitter electrode of each transistor being connected to the collector electrode of the other transistor;

first and second biasing means for supplying biasing voltages to the base electrodes of said NPN and PNP type transistors, respectively;

input signal means;

and first and second capacitor means for supplying said input signal to the base electrodes of said NPN and PNP type transistors, respectively;

said first biasing means comprises third and fourth resistive impedance means connected in series across said power supply means with the common junction therebetween connected to the base of said NPN type transistor;

and in which said second biasing means comprises fifth and sixth resistive impedance means connected in series across said power supply means with the common junction therebetween connected to the base of said PNP type transistor;

and in which said first and second biasing means are constructed to bias said transistors just into their conductive state.

2. A circuit means comprising:

power supply means;

a series circuit arrangement connected across said power supply means and comprising first common impedance means, the parallel combination of an NPN type transistor and a PNP type transistor, and second common impedance means;

said transistors each having emitter, collector, and base electrodes;

the emitter electrodes of each transistor being connected to the collector electrode of the other transistor;

first and second biasing means connected across said power supply and constructed to supply biasing voltages to the base electrodes of said NPN and PNP type transistors, respectively;

input signal means;

and first and second capacitive means for supplying said input signal to the base electrodes of said NPN and PNP type transistors, respectively;

and in which said first and second biasing means are constructed to bias said NPN type transistor and said PNP type transistor, respectively, just into their conductive state.

References Cited

UNITED STATES PATENTS

| | | | |
|---|---|---|---|
| 2,770,728 | 11/1956 | Herzog | 321—60 XR |
| 2,782,267 | 2/1957 | Beck | 307—88.5 |
| 2,827,611 | 3/1958 | Beck. | |
| 2,972,685 | 2/1961 | Baude | 307—88.5 |
| 3,077,545 | 2/1963 | Rywak | 307—88.5 |
| 3,153,187 | 10/1964 | Klees | 323—22 |
| 3,188,495 | 6/1965 | Grimm | 321—8 XR |
| 3,287,620 | 11/1966 | Tuszynski | 321—44 |

JOHN F. COUCH, *Primary Examiner.*

W. SHOOP, *Assistant Examiner.*

U.S. Cl. X.R.

307—255, 288; 321—47, 65